(12) United States Patent
Woerz et al.

(10) Patent No.: US 10,199,330 B2
(45) Date of Patent: Feb. 5, 2019

(54) ALIGNMENT MARK ARRANGEMENT, SEMICONDUCTOR WORKPIECE, AND METHOD FOR ALIGNING A WAFER

(71) Applicant: Infineon Technologies AG, Neubiberg (DE)

(72) Inventors: Andreas Woerz, Kelheim (DE); Erwin Steinkirchner, Straubing (DE)

(73) Assignee: Infineon Technologies AG, Neubiberg (DE)

( * ) Notice: Subject to any disclaimer, the term of this patent is extended or adjusted under 35 U.S.C. 154(b) by 316 days.

(21) Appl. No.: 14/138,161

(22) Filed: Dec. 23, 2013

(65) Prior Publication Data

US 2015/0179584 A1 Jun. 25, 2015

(51) Int. Cl.
 *H01L 23/544* (2006.01)
 *H01L 21/66* (2006.01)
 *G03F 9/00* (2006.01)

(52) U.S. Cl.
 CPC .......... *H01L 23/544* (2013.01); *G03F 9/7076* (2013.01); *G03F 9/7084* (2013.01); *H01L 22/12* (2013.01); *H01L 2223/5442* (2013.01); *H01L 2223/5446* (2013.01); *H01L 2223/54426* (2013.01); *H01L 2924/0002* (2013.01)

(58) Field of Classification Search
 CPC .... G03F 9/7088; G03F 9/7003; G03F 9/7076; G03F 1/144; H01L 23/544
 See application file for complete search history.

(56) References Cited

U.S. PATENT DOCUMENTS

| 6,803,668 | B2 | 10/2004 | Holloway et al. |
| 8,674,524 | B1 | 3/2014 | Woerz et al. |
| 2003/0174879 | A1 | 9/2003 | Chen |
| 2005/0068508 | A1* | 3/2005 | Mattiza ............... G03F 9/7076 355/55 |
| 2008/0225254 | A1* | 9/2008 | Komine ............... G03F 1/144 355/53 |
| 2010/0210088 | A1* | 8/2010 | Ishimaru ............. G03F 9/708 438/401 |
| 2010/0245825 | A1 | 9/2010 | Jang et al. |

FOREIGN PATENT DOCUMENTS

CN 1445819 A 10/2003

OTHER PUBLICATIONS

"Wafer Alignment for Canon Stepper", Dr. Lynn Fuller, Rochester Institute of Technology Microelectronic Engineering, Jan. 14, 2008 (Power Point Presentation).

* cited by examiner

*Primary Examiner* — Matthew E Warren
(74) *Attorney, Agent, or Firm* — Viering, Jentschura & Partner mbB

(57) ABSTRACT

In various embodiments, an alignment mark arrangement may include a plurality of alignment marks disposed next to each other in a row, wherein at least one of the following holds true: a first alignment mark of the plurality of alignment marks has a first width and a second alignment mark of the plurality of alignment marks has a second width that is different from the first width; a first pair of neighboring alignment marks of the plurality of alignment marks is arranged at a first pitch and a second pair of neighboring alignment marks of the plurality of alignment marks is arranged at a second pitch that is different from the first pitch.

11 Claims, 10 Drawing Sheets

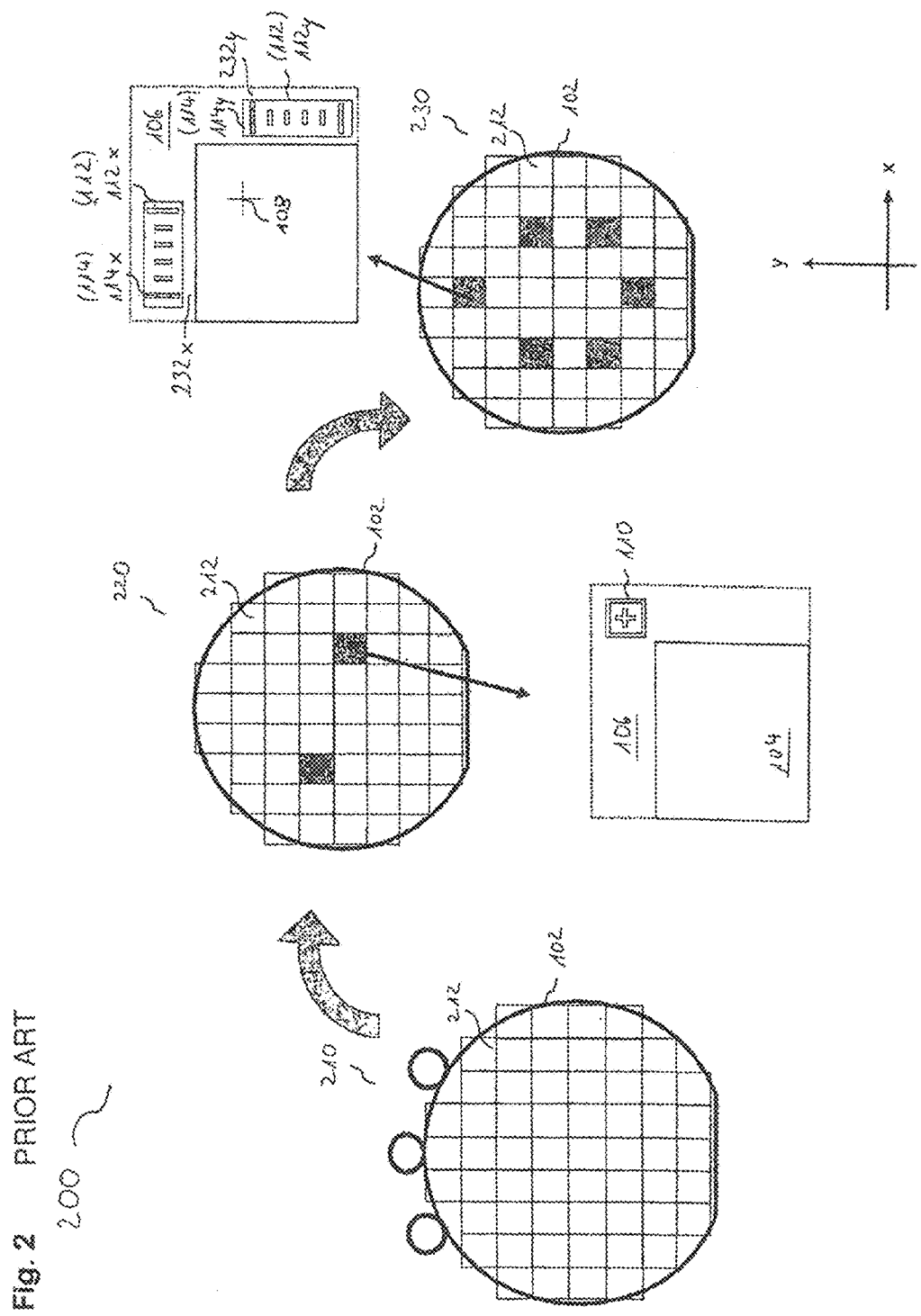

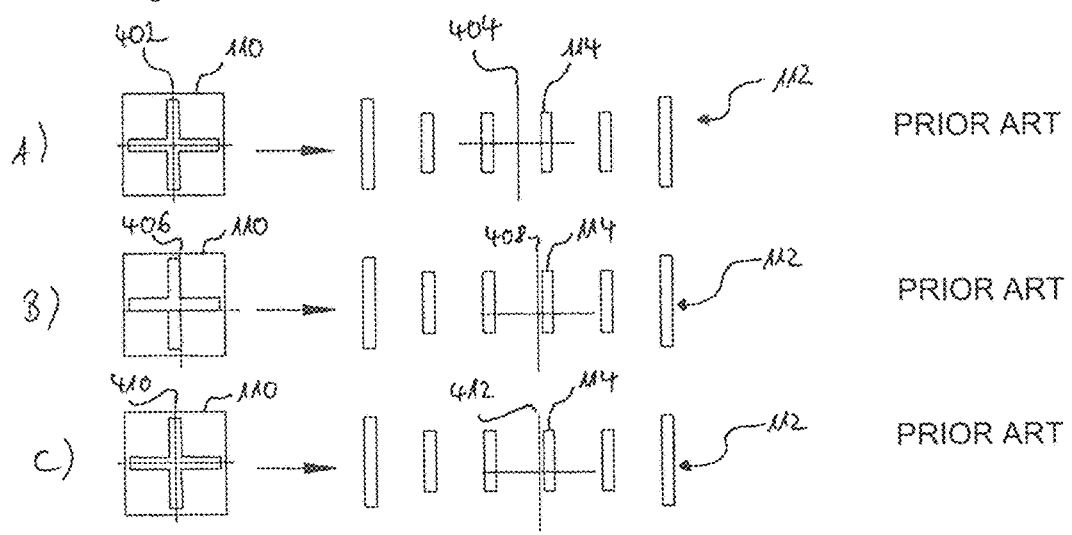

Fig. 5
PRIOR ART
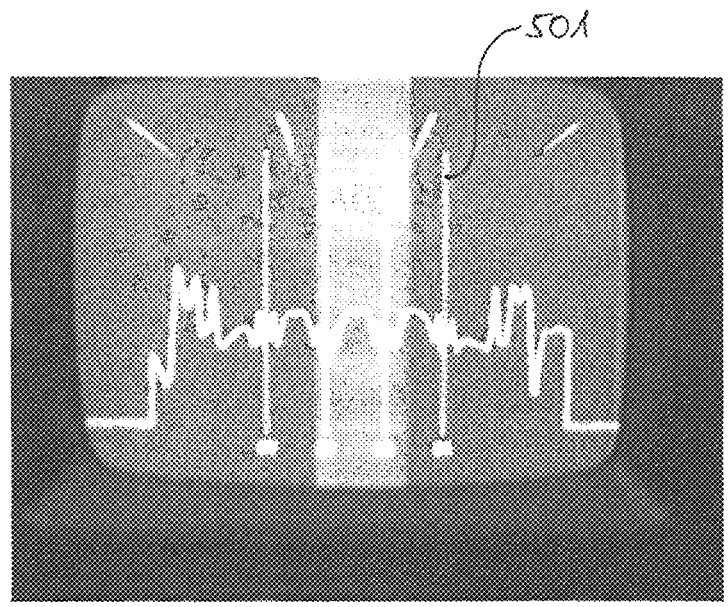
Fig. 6
A)  PRIOR ART
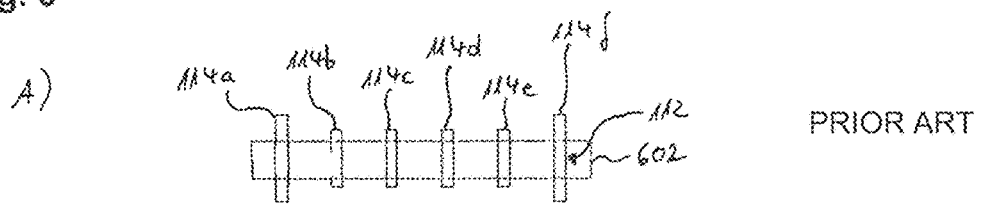
B)  PRIOR ART
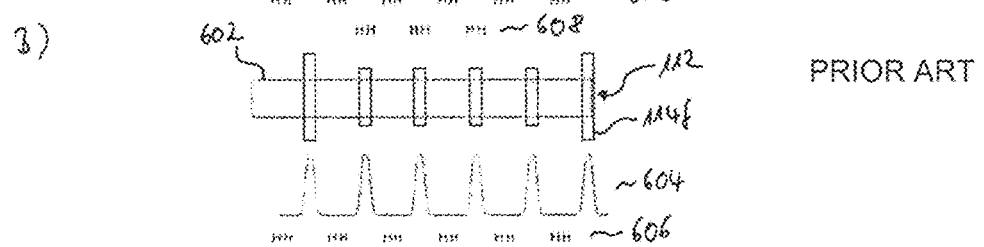
C)  PRIOR ART
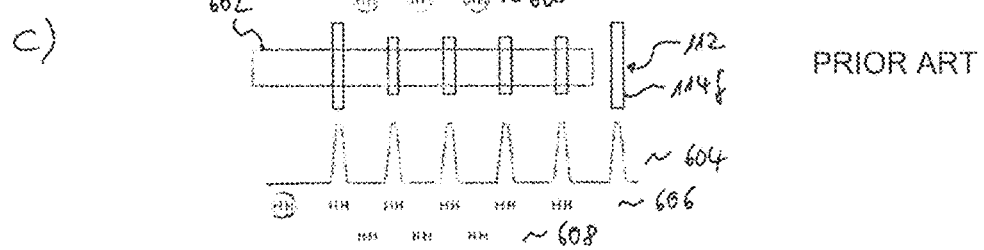

Fig. 7
A)
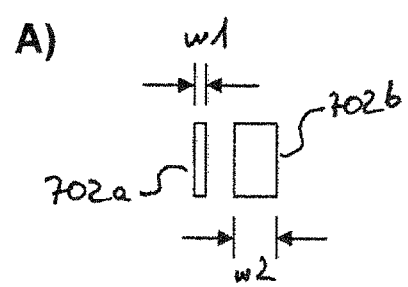
B)
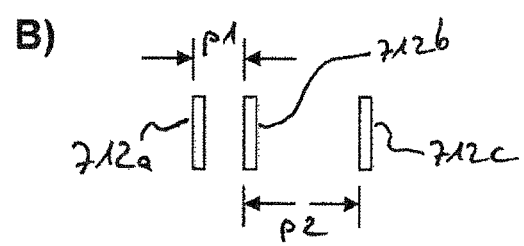

ALIGNMENT MARK ARRANGEMENT, SEMICONDUCTOR WORKPIECE, AND METHOD FOR ALIGNING A WAFER

TECHNICAL FIELD

Various embodiments relate generally to an alignment mark arrangement, a semiconductor workpiece, and a method for aligning a wafer.

BACKGROUND

Modern semiconductor devices such as, for example, integrated circuit (IC) devices or chips may typically be manufactured by processing a semiconductor carrier such as a wafer. Integrated circuits may include a plurality of layers, e.g. one or more semiconducting, insulating, and/or conducting layers, which may be stacked one over the other. In this connection, overlay (alignment) of an upper layer to a lower layer may be important. Alignment marks may typically be used for alignment, for example when aligning lithographically defined layers e.g. by means of a stepper or scanner.

When adjusting litholayers using a stepper/scanner apparatus, alignment jumps may occur.

For obviating this problem, the stepper/scanner apparatus conventionally includes a software solution which checks if contrast differences at measurement positions (e.g. at measurement bars) are larger than between the measurement positions. Further, marks adjacent to the measurement bars (fence bars) are checked.

Disadvantages of the software solution are that the software solution may not work properly or may have to be deactivated, respectively, during the alignment process if interferences bring about high contrast differences between the measurement bars, if the width of the bars is equal to half the distance between the bars, or if the bars adjacent to the measurement bars (i.e. the fence bars) show a contrast difference which is different when compared to the measurement bars.

It may be desirable to provide an alternative way to determine and/or avoid alignment jumps, without using the software solution.

SUMMARY

An alignment mark arrangement in accordance with various embodiments may include a plurality of alignment marks disposed next to each other in a row, wherein at least one of the following holds true: a first alignment mark of the plurality of alignment marks has a first width and a second alignment mark of the plurality of alignment marks has a second width that is different from the first width; a first pair of neighboring alignment marks of the plurality of alignment marks is arranged at a first pitch and a second pair of neighboring alignment marks of the plurality of alignment marks is arranged at a second pitch that is different from the first pitch.

An alignment mark arrangement in accordance with various embodiments may include a plurality of alignment marks disposed next to each other in a row, wherein the alignment mark arrangement includes an asymmetry in at least one of a pitch and a width of the alignment marks.

A semiconductor workpiece in accordance with various embodiments may include at least one alignment mark arrangement, including a plurality of alignment marks disposed next to each other in a row, wherein at least one of the following holds true: a first alignment mark of the plurality of alignment marks has a first width and a second alignment mark of the plurality of alignment marks has a second width that is different from the first width; a first pair of neighboring alignment marks of the plurality of alignment marks is arranged at a first pitch and a second pair of neighboring alignment marks of the plurality of alignment marks is arranged at a second pitch that is different from the first pitch.

A method for aligning a wafer in accordance with various embodiments may include providing a wafer having at least one alignment mark arrangement, the alignment mark arrangement including: a plurality of alignment marks disposed next to each other in a row, wherein at least one of the following holds true: a first alignment mark of the plurality of alignment marks has a first width and a second alignment mark of the plurality of alignment marks has a second width that is different from the first width; a first pair of neighboring alignment marks of the plurality of alignment marks is arranged at a first pitch and a second pair of neighboring alignment marks of the plurality of alignment marks is arranged at a second pitch that is different from the first pitch; irradiating light to the at least one alignment mark arrangement; collecting reflected light from the alignment mark arrangement; analyzing optical information of the collected light; and determining a location of the wafer based on the analyzed optical information

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 2 shows an illustration of a typical alignment process;

FIG. 4A to FIG. 4C show correct alignment and typical faults occurring during conventional fine-alignment, respectively;

FIG. 5 shows a typical alignment image of a stepper apparatus screen during an alignment process;

FIG. 6A to FIG. 6C show schematic views illustrating a conventional software method for determining an alignment jump as implemented in a stepper/scanner apparatus;

FIG. 7A shows an alignment mark arrangement including alignment marks having different widths according to an embodiment, and FIG. 7B shows an alignment mark arrangement including alignment marks having different pitches between pairs of neighboring alignment marks according to another embodiment;

DESCRIPTION

Figure 1:
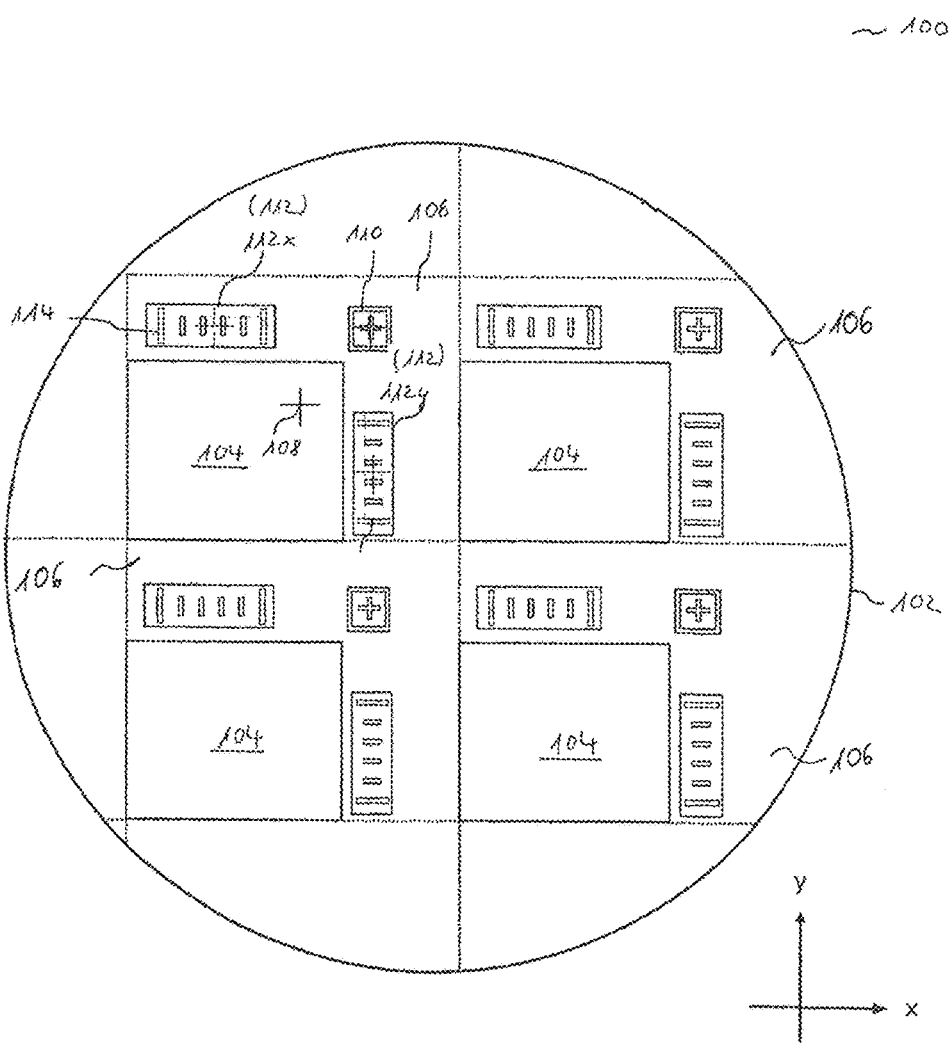
FIG. 1 shows a top view of a semiconductor workpiece including dies.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, logical, and electrical changes may be made without departing from the scope of the invention. The various embodiments are not necessarily mutually exclusive, as some embodiments can be combined with one or more other embodiments to form new embodiments.

Note that in this specification, references to various features (e.g., region, layer, process, steps, stack, characteristics, material, etc.) included in "one aspect", "one embodiment", "example aspect", "an aspect", "another aspect", "some aspect", "various aspects", "other aspects", "alternative aspect", and the like are intended to mean that any such features are included in one or more aspects of the present disclosure, but may or may not necessarily be combined in the same aspects. Various aspects of the disclosure are provided for methods, and various aspects of the disclosure are provided for devices or manufactures. It will be understood that basic properties of the methods also hold for the devices or manufactures and vice versa. Therefore, for sake of brevity, duplicate description of such properties may be omitted.

The word "exemplary" is used herein to mean "serving as an example, instance, or illustration". Any embodiment or design described herein as "exemplary" is not necessarily to be construed as preferred or advantageous over other embodiments or designs.

Note that in this specification, references to "at least one of" may mean any combination. For example, at least one of object A and object B may be object A, object B, or both objects A and B.

The word "over", used herein to describe forming a feature, e.g. a layer, "over" a side or surface, may be used to mean that the feature, e.g. the layer may be formed "directly on", e.g. in direct contact with, the implied side or surface. The word "over", used herein to describe forming a feature, e.g. a layer "over" a side or surface, may be used to mean that the feature, e.g. the layer may be formed "indirectly on" the implied side or surface with one or more additional layers being arranged between the implied side or surface and the formed layer.

Although the description is illustrated and described herein with reference to certain aspects, the description is not intended to be limited to the details shown. Modifications may be made in the details within the scope and range equivalents of the claims.

When aligning litholayers, i.e. lithographically defined layers, automatically by means of a stepper or scanner, disadvantageous combination of a plurality of factors of the aligning process may lead to so-called alignment jumps, i.e. bad alignment results, e.g. during or after transition from pre-alignment to fine-alignment. These factors may include or may be, for example, the design of alignment marks, the width of alignment marks and the pitch between alignment marks, interferences between alignment marks (e.g. optical interference patterns generated during the reading or recognition of alignment marks during the adjustment of litholayers with a stepper or scanner), wrong shift settings in the facility, i.e. scanner or stepper, and bad pre-alignment. These alignment jumps may result in inaccuracies in alignment of the wafer during lithographic exposure in the stepper or scanner.

FIG. 1 shows a top view of a semiconductor workpiece 102.

Referring to FIG. 1, view 100 shows a top view of semiconductor workpiece 102, which may be a semiconductor wafer, including a plurality of die regions 104 and kerf regions 106 adjacent to the die regions 104. A die region 104 may refer to a region of semiconductor workpiece 102 where e.g. through lithographic patterning, e.g. exposure, and semiconductor fabrication processes, one or more electronic devices may be formed. Semiconductor workpiece 102 may include at least one alignment mark 114, including an elongate pattern.

Semiconductor workpiece 102 may include a plurality of alignment marks 114, each alignment mark 114 of the plurality of alignment marks 114 may include an elongate pattern.

A group of alignment marks may be referred to as alignment mark set 112 or alignment mark arrangement 112 or multimark shown in view 100. Each alignment mark set 112 may include a plurality of alignment marks 114, e.g. two or more, e.g. six, eight or ten alignment marks 114, and may be formed in a kerf region 106 adjacent to a die region 104 over a top surface of semiconductor workpiece 102. Each of alignment marks 114 may be configured as fine-alignment mark. In this case, alignment mark set 112 may also be referred to as fine-alignment mark set 112.

At least two TV pre-alignment marks (TVPA marks) 110 may be formed over a top surface of semiconductor workpiece 102. As shown in view 100, only four die regions 104 are illustrated in semiconductor workpiece 102 for the sake of simplicity. It may be understood however, that it may be common for semiconductor workpiece 102 to include a plurality of dies, e.g. tens, hundreds or even thousands of dies. Each die region 104 may (at least partially) be surrounded by a kerf or edge region 106, in which fine alignment mark sets 112 and/or TV pre-alignment marks 110 may be formed.

Referring to FIG. 1, each kerf region 106 surrounding a respective die region 104 may include two alignment mark sets 112. As depicted in FIG. 1, a first alignment mark set 112x refers to an alignment mark set 112 which extends in a direction of an x-axis of the semiconductor workpiece 102, while a second alignment mark set 112y refers to an alignment mark set 112 which extends in a direction of a y-axis of the semiconductor workpiece 102. First alignment mark set 112x and second alignment mark set 112y disposed in a particular kerf region 106 of a respective die region 104 may be used for locating center 108 of each of first alignment mark set 112x and second alignment mark set 112y.

FIG. 2 shows an illustration of a typical alignment process.

FIG. 2 shows illustration 200 of an alignment process. In preparation for photolithographic exposure, resist 212 may be formed over the top surface of semiconductor workpiece 102. Furthermore, a reticle or photomask may be aligned to the stepper or to an optical column of the stepper using fiducial reticle marks located at the edge regions of the reticle.

In 210, basic wafer alignment may be carried out, and semiconductor workpiece 102 may be placed on a moveable stage.

Semiconductor workpiece 102 may be aligned with respect to a stepper or scanner using the different sets or types or groups of alignment marks. Subsequent to basic wafer alignment of 210, in 220, pre-alignment may be carried out using a first group of alignment marks, e.g. TV pre-alignment marks 110, as depicted in the enlarged view. At least two TV pre-alignment marks 110 of two dies, shown as darkened dies of semiconductor workpiece 102 in 220, may be used to adjust for rotation and may be used to carry out an alignment of lower accuracy (i.e. pre-alignment). TV pre-alignment marks 110 may be detected with lower magnification and prepositioned using moving or rotating a stage in x (horizontal) and y (vertical) directions for block x-y pre-positioning. Alignment using TV pre-alignment marks 110 may only provide accuracy between about 2 µm to about 4 µm, and may be carried out using an off-axis scope.

In 230, a second group of alignment marks, e.g. fine-alignment mark sets 112, e.g. 112x, 112y, as depicted in the enlarged view, may subsequently be used to refine alignment provided previously by TV pre-alignment marks 110, in an auto global alignment (AGA) process. Each fine-alignment mark set 112 may include a plurality of alignment marks 114. Each alignment mark 114 may be configured as a fine-alignment mark 114 of semiconductor workpiece 102.

An adjustment light, e.g. Broadband (612+/−35 nm) or a HeNe laser (612 nm) may be used to illuminate the fine-alignment mark sets 112. Each kerf region 106 may include a first fine-alignment mark set 112x of alignment marks 114x in the x direction, and a second fine-alignment mark set 112y of alignment marks 114y in the y direction. First set 112x may be arranged wherein alignment marks 114x may be arranged in an x direction with respect to each other. Second set 112y may be arranged wherein alignment marks 114y may be arranged in a y direction with respect to each other. Alignment marks 114x and alignment marks 114y may face directions substantially perpendicular to each other. For example, a longitudinal axis 232x of alignment mark 114x may be perpendicular to an x direction, and a longitudinal axis 232y of alignment mark 114y may be parallel to the x direction.

As mentioned above, both first set 112x and second set 112y may need to be used in order to locate the center 108 for each of sets 112x and 112y. An image of fine-alignment mark sets 112x and 112y may be viewed and analyzed. A moveable stage carrying semiconductor workpiece 102 may move in an x-y direction and may place first set 112x under a first alignment microscope, e.g. a C-scope. The image of the fine-alignment mark set may be analyzed to determine the correction in the x alignment, in other words, to determine a block X position. The stage carrying semiconductor workpiece 102 may move in an x-y direction to place second set 112y under a second alignment microscope, e.g. a B-scope. The image of the fine-alignment mark set may be analyzed to determine the correction in the y alignment, in other words, to determine a block Y position. The stepper machine may then calculate the stage position to center the die region 104 of semiconductor workpiece 102 under an optical column of the stepper, using the located center 108. The stage may move the semiconductor workpiece 102 such that die region 104 is directly centered under the optical column.

As this process aligns the semiconductor workpiece 102 with respect to the optical column, and as the reticle may already have been aligned with respect to the optical column, exposure may be carried out through the reticle wherein selected portions of resist 212 formed over semiconductor workpiece 102 may be exposed. In particular, selected portions of resist 212 formed over die regions 104, such as selected portions not blocked by reticle, may be exposed to light, e.g. UV light.

Figure 3A:
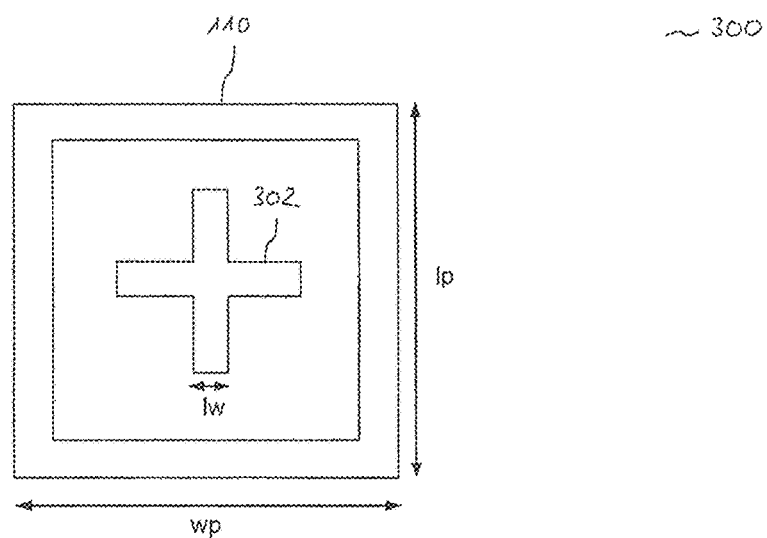
FIG. 3A shows a typical pre-alignment mark.

An example of a TV pre-alignment mark 110 used for pre-alignment is shown in top view 300 of FIG. 3A. As shown in view 300, pre-alignment mark 110 may include generally a fan-out structure, e.g. such as a cross-shaped structure 302. Each TV pre-alignment mark 110 may generally be quite large, and may have a width, wp, and/or length, lp, ranging from about 40 µm to about 100 µm, e.g. from about 50 µm to about 80 µm, e.g. from about 55 µm to about 65 µm, e.g. about 60 µm. The width, lw, of the cross-shaped structure 302 may range from about 5 µm to about 10 µm, e.g. about 6 µm.

Figure 3B:
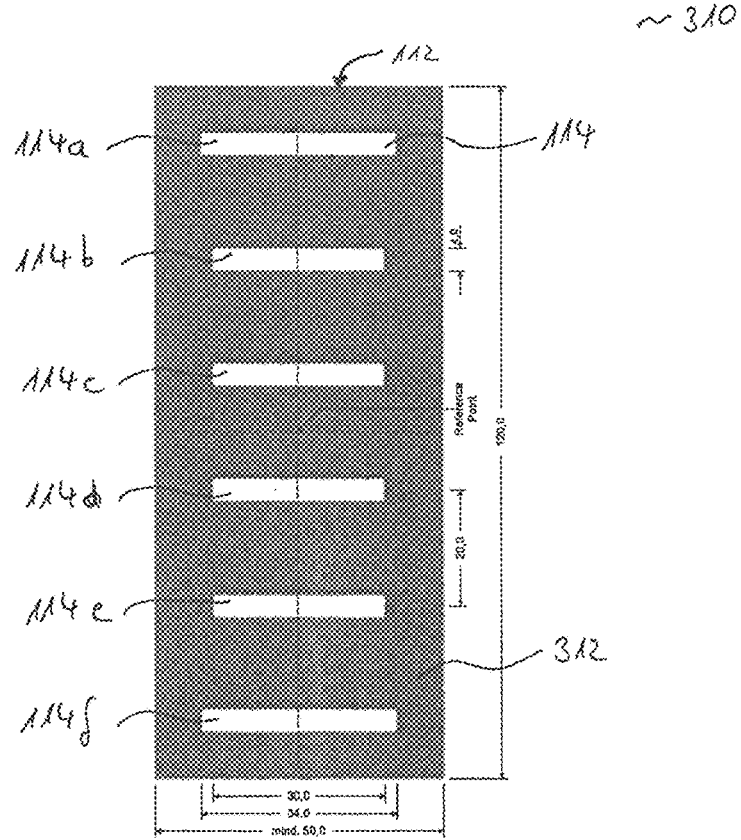
FIG. 3B shows a group of typical fine-alignment marks.

A conventional fine-alignment mark set or arrangement 112 used for fine-alignment is shown in top view 310 of FIG. 3B. Fine alignment mark set 112 may include alignment marks 114. Fine alignment mark set 112 may be formed over a semiconductor workpiece 102, for example, in an edge or border region of semiconductor workpiece 102 or in the edge or kerf region 106 of a die in a wafer. Semiconductor workpiece 102 may be a semiconductor wafer substrate, e.g. a silicon wafer.

As shown in view 310 of FIG. 3B, the fine alignment mark set 112 may include six alignment marks 114, e.g. alignment marks 114a, 114b, 114c, 114d, 114e, 114f.

Each of the alignment marks 114 of the alignment mark set 112 may have an elongate structure, wherein each of the alignment marks 114 may have a width of about 4 µm as an example (as shown in FIG. 3B). The outermost alignment marks 114, i.e. outermost alignment mark 114a and outermost alignment mark 114f, of the alignment mark set 112 conventionally are called fence bars and generally are longer than inner alignment marks 114, i.e. inner alignment marks 114b, 114c, 114d, and 114e, of the alignment mark set 112. Inner alignment marks 114b, 114c, 114d, and 114e conventionally are called measurement bars. As shown in FIG. 3B, fence bars may have a length of about 34 µm as an example while measurement bars may have a length of about 30 µm as an example (as shown in FIG. 3B). The whole alignment mark set 112 may have an overall length of about 120 µm as an example and an overall width of at least about 50 µm as an example (as shown in FIG. 3B). Other dimensions may be possible as well, as will be readily understood.

Each alignment mark 114 may be separated from a neighboring alignment mark 114 by a pitch p, which may be about 20 µm, as an example (as shown in FIG. 3B). Pitch p generally may be referred to as a pitch between the bars, e.g. between a first edge of a first alignment mark 114a and an analogous edge of a second alignment mark 114b, the second alignment mark 114b neighboring or being directly adjacent to the first alignment mark 114a. A half pitch, ph, refers to half the distance between neighboring alignment marks, e.g. half the distance between first alignment mark 114a and second alignment mark 114b, e.g. half of pitch p.

FIG. 4A to FIG. 4C show correct alignment and typical faults occurring during conventional fine-alignment, respectively.

FIG. 4A illustrates correct pre-alignment (on the left-hand side) and correct fine alignment (on the right-hand side). As can be seen in FIG. 4A (left-hand side), in a first microscope of a first stepper/scanner apparatus, pre-alignment mark 110 is correctly aligned to the optical column of the microscope (schematically depicted as cross 402) during pre-alignment. In a subsequent second step (right-hand side of FIG. 4A), in a second microscope of the stepper/scanner apparatus, fine-alignment marks 114 of alignment mark set 112 are also correctly aligned to the optical column of the microscope (schematically depicted as cross 404) during fine-alignment.

FIG. 4B illustrates the effect of bad TV pre-alignment (TVPA). As shown in FIG. 4B (left-hand side), in a first microscope of a first stepper/scanner apparatus, pre-alignment mark 110 is not correctly aligned to the optical column of the microscope (schematically depicted as cross 406) during pre-alignment, such that cross 406 indicating the optical column of the first microscope, is shifted sidewards and downwards with respect to pre-alignment mark 110. Therefore, in a subsequent second step (right-hand side of FIG. 4B), in a second microscope of the stepper/scanner apparatus, fine-alignment marks 114 of alignment mark set 112 are also not correctly aligned to the optical column of the microscope (schematically depicted as cross 408) during fine-alignment, such that cross 408 indicating the optical column of the second microscope, is shifted sidewards and downwards with respect to the pre-alignment marks 114.

Thus, as shown in FIG. 4B, if the stepper or scanner is not able to adjust the microscope correctly with respect to the TV pre-alignment mark 110 (left-hand side), this fault may also result in bad fine-alignment (right-hand side).

FIG. 4C illustrates the effect of wrong shift settings (e.g. wrong offset between first microscope used for pre-alignment and second microscope used for fine-alignment) in the facility, i.e. scanner or stepper. As shown in FIG. 4C (left-hand side), in a first microscope of a first stepper/scanner apparatus, pre-alignment mark 110 is correctly aligned to the optical column of the microscope (schematically depicted as cross 410) during pre-alignment. In a subsequent second step (right-hand side of FIG. 4C), in a second microscope of the stepper/scanner apparatus, fine-alignment marks 114 of alignment mark set 112 are not correctly aligned to the optical column of the microscope (schematically depicted as cross 412) during fine-alignment, such that cross 412 indicating the optical column of the second microscope, is shifted sidewards and downwards with respect to the pre-alignment marks 114.

Thus, as shown in FIG. 4C, although the TV pre-alignment process may be performed correctly (left-hand side), wrong shift settings as e.g. wrong offset between the first microscope and the second microscope in the scanner or stepper (sometimes also referred to as wrong LowMag) may result in bad fine-alignment (right-hand side).

Due to the symmetrical design of the conventional alignment mark set 112, alignment jumps as shown in FIG. 4B and FIG. 4C (right-hand side each) in each case may correspond to a half pitch ph or a pitch p, in other words may correspond to half of the distance between the alignment marks 114 or the full distance between the alignment marks 114.

FIG. 5 shows a typical image of a scanner/stepper-TV screen during an alignment process.

A detector signal 501 displayed on the stepper-TV screen represents contrast variation along a longitudinal direction of a fine alignment mark set 112. As can be seen from the signal 501 displayed on the stepper-TV screen of FIG. 5, the automatic alignment process here is performed using an alignment mark set 112 including four measuring bars, i.e. inner alignment marks 114, i.e. inner alignment marks 114b, 114c, 114d, and 114e. The two broader signal peaks of the signal 501 to the right-hand side and the left-most side, respectively, result from the fence bars, i.e. outermost alignment marks 114, i.e. outermost alignment marks 114a and 114f, respectively, of the fine-alignment mark set 112 used for alignment.

In order to avoid problems occurring during the alignment process, as described above in reference to FIG. 4, a scanner/stepper apparatus generally may apply a software solution for checking if contrast differences at the measuring positions, i.e. the positions of the measurement bars, e.g. inner alignment marks 114b, 114c, 114d, and 114e of the alignment mark set 112, are larger than contrast differences between measuring positions, i.e. between the positions of the measurement bars. Further, marks adjacent to the measurement bars, i.e. fence bars, e.g. outermost alignment marks 114a and 114f of the alignment mark set 112, are checked.

FIG. 6A to FIG. 6C show schematic views illustrating a conventional software method, i.e. a software solution, for detecting an alignment jump, as implemented in a conventional stepper/scanner.

FIG. 6A shows a schematic view of a detector signal obtained from an alignment mark set 112 in a scanner/stepper when the alignment mark set is in a so-called zero position with respect to a measuring window of an alignment microscope.

Referring to FIG. 6A, a measuring window 602 (or B/C-scope window 602) of a first alignment microscope, e.g. a C-scope, or a second alignment microscope, e.g. a B-scope, is positioned centrally over an alignment mark set 112, so that a detector signal 604, e.g. High Resolution Detector signal or HRD-signal 604, received from the alignment marks 114. An intensity of HRD-signal 604 is measured in each of measuring intervals 606, 608 depicted as H-icons under the HRD-signal 604. Therein, measuring intervals 606 refer to measuring intervals 606 at measuring positions where (in case of correct alignment) an edge of a respective measuring bar (i.e. an alignment mark 114), and thus noticeable contrast variation, is to be expected (also called bar windows 606), while measuring intervals 608 refer to measuring intervals 608 at measuring positions where (in case of correct alignment) an edge of a measuring bar (i.e. an alignment mark 114), and thus a noticeable contrast variation, is not to be expected (also called blank windows 608). Therein, each measuring interval 606, 608 is represented by a pair of H-icons, one corresponding to the left-hand edge of an alignment mark 114, and the other corresponding to the right-hand edge of the same alignment mark 114. In a conventional scanner/stepper apparatus, the width covered by the pair of H-icons representing a particular alignment mark 114 always is the same, and the distance between two pairs of H-icons representing two adjacent/neighboring alignment marks 114 also always is the same.

As shown in FIG. 6A, when the alignment mark set 112 is in the zero position with respect to the B/C-scope window 602 (or measuring window 602), the signal 604 shows signal peaks corresponding to positions of respective alignment marks 114 and shows low intensity at positions of respective areas between the alignment marks 114. Thus, in FIG. 6A, the peaks of signal 604 correspond to the expected pattern of alignment marks 114 of the alignment mark set 112 within the B/C-scope window 602, such that the software method conventionally implemented in a scanner/stepper for determining an alignment jump determines that the semiconductor workpiece 102 is correctly aligned in a zero position without alignment jump.

FIG. 6B shows a schematic view of a detector signal obtained from an alignment mark set 112 in a scanner/stepper when the alignment mark set 112 is in a so-called halfpitch position with respect to a measuring window of an alignment microscope, i.e. the alignment mark set 112 is shifted to one side by half of the pitch p between neighboring alignment marks 114 with respect to the B/C-scope window.

As shown in FIG. 6B, when the alignment mark set 112 is in a halfpitch position, the signal 604 shows zero line portions in the measuring intervals 606 corresponding to positions of areas between the alignment marks 114, while the signal 604 shows peaks in the measuring intervals 608 corresponding to positions of respective alignment marks 114 (see encircled H-icons 608). Thus, in FIG. 6B, the peaks of signal 604 measured in measuring intervals 608 correspond to positions, at which no alignment marks 114 were to be expected if the alignment was correct, while the zero line portions of signal 604 determined in the measuring intervals 606 correspond to positions, at which alignment marks 114 were to be expected if the alignment was correct.

Thus, in FIG. 6B, the peaks of signal 604 (at the positions of encircled H-icons 608) do not correspond to the expected pattern of alignment marks 114 of the alignment mark set 112 within the B/C-scope window 602, such that the software method conventionally implemented in a scanner/stepper for determining an alignment jump may determine that the semiconductor workpiece 102 is not correctly aligned, but is arranged in a halfpitch position, i.e. showing an alignment jump of half of the pitch, ph.

FIG. 6C shows a schematic view of a detector signal obtained from an alignment mark set 112 in a scanner/stepper when the alignment mark set 112 is in a so-called pitch position with respect to a measuring window of an alignment microscope, i.e. the alignment mark set 112 is shifted to one side by a full pitch p between neighboring alignment marks 114 with respect to the B/C-scope window.

As shown in FIG. 6C, when the alignment mark set 112 is in a pitch position, the signal 604 shows signal peaks in the measuring intervals 606 corresponding to positions of respective alignment marks 114, while the signal 604 shows zero line portions in the measuring intervals 608 corresponding to positions of respective areas between the alignment marks 114. However, the signal 604 shows a zero line portion at the outer left-hand side of the B/C-scope window 602 at a position corresponding to a measurement interval 606 (see encircled H-icon 606), while signal 604 shows a peak at a position at the outer right-hand side outside the B/C-scope window 602, i.e. not at a position corresponding to a measurement interval 606.

Thus, in FIG. 6C, only five of the six peaks of signal 604 correspond to the expected pattern of alignment marks 114 of the alignment mark set 112 within the B/C-scope window 602 while, illustratively, the sixth peak (corresponding to the right fence bar 1140 is missing in the B/C-scope window 602, such that the software method conventionally implemented in a scanner/stepper for determining an alignment jump may determine that the semiconductor workpiece 102 is not correctly aligned, but is arranged in a pitch position, i.e. showing an alignment jump of one pitch p.

However, the software method for determining an alignment jump in an alignment process of a semiconductor workpiece 102 conventionally implemented in a scanner/stepper often does not function properly, due to several reasons, or has to be deactivated during fine-alignment executed by hand. Examples for these reasons are: high contrast differences between signals detected from measurement bars due to optical interference; the width of alignment marks 114 corresponds to half the pitch p between two neighboring alignment marks 114; fence marks 114 (i.e. outermost alignment marks 114a and 114f of the alignment mark set 112) have a contrast difference which differs from the contrast difference of measuring marks 114 (i.e. inner alignment marks 114b, 114c, 114d, and 114e).

In accordance with various embodiments, a design of the alignment marks is modified such that the software method implemented in conventional scanner/stepper facilities may no longer be required for avoiding alignment jumps.

Various embodiments of the present application provide asymmetrical alignment marks (e.g. fine-alignment marks) for stepper light exposure.

According to embodiments of the present application, an alignment mark arrangement including an asymmetric pattern (with respect to dimensions and/or pitches) of alignment marks is provided, differing from a conventional symmetric pattern of alignment marks in a conventional alignment mark set. For example, according to embodiments of the present application, the characteristics of a conventional pattern of alignment marks of equal width of all the alignment marks and equal pitch between each pair of neighboring alignment marks may be abolished.

Due to the asymmetry in width and/or pitch, alignment jumps may be detected and/or avoided without using a software solution. For example, an alignment mark arrangement with asymmetric pattern of alignment marks may produce a characteristic detector signal (in case of correct alignment) and deviations from this characteristic signal may be easily detected, and thus, alignment errors may be easily detected.

In accordance with various embodiments, an alignment mark arrangement may include a plurality of alignment marks disposed next to each other in a row, wherein at least one (e.g. both) of the following holds true: a first alignment mark of the plurality of alignment marks has a first width and a second alignment mark of the plurality of alignment marks has a second width that is different from the first width; a first pair of neighboring alignment marks of the plurality of alignment marks is arranged at a first pitch and a second pair of neighboring alignment marks of the plurality of alignment marks is arranged at a second pitch that is different from the first pitch.

FIG. 7A shows an alignment mark arrangement including alignment marks having different widths according to an embodiment, and FIG. 7B shows an alignment mark arrangement including alignment marks having different pitches between each pair of neighboring alignment marks according to another embodiment. The alignment mark arrangements may also be referred to as alignment mark sets, or multi-marks.

In FIG. 7A, two alignment marks 702, which are disposed next to each other in a row, are depicted, having different widths w, wherein a first alignment mark 702a on the left-hand side of FIG. 7A has a first width w1 which is smaller than the second width w2 of second alignment mark 702b on the right-hand side of FIG. 7A. In another embodiment, w2 may be smaller than w1.

In accordance with another embodiment, the width of an alignment mark may be measured along a row direction.

In accordance with another embodiment, the width may correspond to a dimension of the alignment mark in the row direction.

In accordance with an embodiment, the first alignment mark and the second alignment mark may be neighboring alignment marks.

In accordance with another embodiment, at least one additional alignment mark may be disposed between the first alignment mark and the second alignment mark.

In accordance with another embodiment, the second width w2 may be at least two times the first width w1, or vice versa.

In accordance with other embodiments, the second width w2 may be at least three times, e.g. at least four times, e.g. at least five times, e.g. at least ten times, the first width w1, or vice versa.

In accordance with another embodiment, the length of an alignment mark may correspond to a dimension of the alignment mark perpendicular to the width of the alignment mark.

In accordance with another embodiment, the length of an alignment mark may be measured perpendicularly to the row direction.

The lengths of the alignment marks may be the same (as shown), or they may be different. The alignment marks may further be configured in accordance with one or more embodiments described herein.

In FIG. 7B, three alignment marks 712, which are disposed next to each other in a row, are depicted, having different pitches between pairs of neighboring alignment marks 712. Therein, pitch p1 between alignment mark 712a and neighboring alignment mark 712b of FIG. 7B, i.e. the distance between e.g. the left edge of alignment mark 712a and the left edge of alignment mark 712b, is smaller than pitch p2 between alignment mark 712b and neighboring alignment mark 712c of FIG. 7B. In other words, a first pitch p1 between a first pair of neighboring alignment marks 712a/712b is smaller than a second pitch p2 between a second pair of neighboring alignment marks 712b/712c. In another embodiment, p2 may be smaller than p1.

In accordance with another embodiment, the pitch may be measured along the row direction.

In accordance with another embodiment, the pitch may correspond to a distance between two neighboring alignment marks in the row direction.

In accordance with another embodiment, the second pitch p2 may be at least two times the first pitch p1, or vice versa.

In accordance with other embodiments, the second pitch p2 may be at least three times, e.g. at least four times, e.g. at least five times, e.g. at least ten times, the first pitch p1, or vice versa.

The lengths of the alignment marks may be the same (as shown), or they may be different. The alignment marks may further be configured in accordance with one or more embodiments described herein.

Figure 8A:
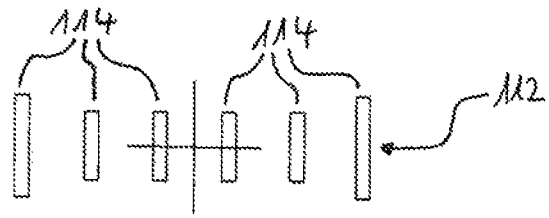
FIG. 8A shows a conventional pattern of alignment marks.

In FIG. 8A, a conventional pattern of alignment marks 114 of an alignment mark set 112, i.e. a standard design, is depicted for comparison with embodiments.

FIG. 8B to FIG. 8J show examples of new designs of alignment mark arrangements according to various embodiments. Crosslines in FIG. 8A-E may indicate a symmetry center in the alignment mark arrangements.

Figure 8B:
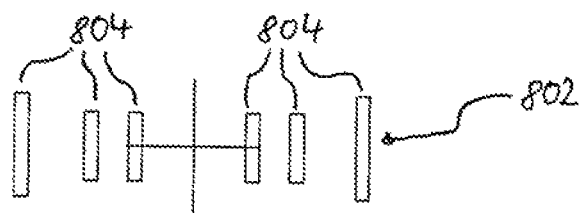
FIG. 8B to FIG. 8J show alignment mark arrangements according to various embodiments.

Referring to FIG. 8B, according to an embodiment, alignment marks 804 of an alignment mark arrangement 802 may have different distances between neighboring alignment marks 802, such that a pattern of alignment marks 804 of an alignment mark arrangement 802 shows an asymmetric pitch between marks (e.g. bars). For example, a pitch between two innermost alignment marks 804 may be greater than a pitch between one of the two innermost alignment marks and a neighboring mark 804, as shown.

Figure 8C:
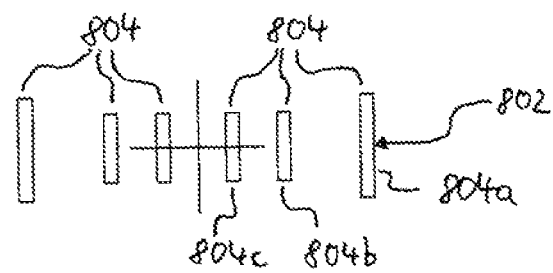

Referring to FIG. 8C, according to another embodiment, alignment marks 804 of an alignment mark arrangement 802 may have different distances between neighboring alignment marks 802, such that the pattern of alignment marks 804 of an alignment mark arrangement 802 shows another asymmetric pitch between marks (e.g. bars). For example, a pitch between an outermost alignment mark 804a and a neighboring alignment mark 804b may be greater than a pitch between alignment mark 804b neighboring an outermost alignment mark 804a and alignment mark 804c neighboring alignment mark 804b on the side opposite to outermost alignment mark 804a.

Figure 8D:
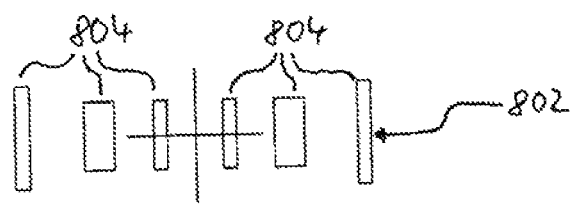

Referring to FIG. 8D, according to another embodiment, alignment marks 804 of an alignment mark arrangement 802 may have different widths, such that a pattern of alignment marks 804 of an alignment mark arrangement 802 shows an asymmetric mark (e.g. bar) width. For example, widths of two innermost marks 804 may be smaller than widths of the neighboring marks 804 adjacent to the innermost marks 804. Alternatively or in addition (as shown), widths of two outermost marks 804 may be smaller than widths of the neighboring marks 804 adjacent to the outermost marks 804.

Figure 8E:
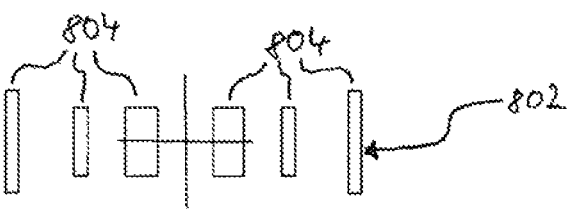

Referring to FIG. 8E, according to another embodiment, alignment marks 804 of an alignment mark arrangement 802 may have different widths, such that a pattern of alignment marks 804 of an alignment mark arrangement 802 shows another asymmetric mark (e.g. bar) width. For example, widths of two innermost marks 804 may be greater than widths of the neighboring marks 804 adjacent to the innermost marks 804.

Figure 8F:
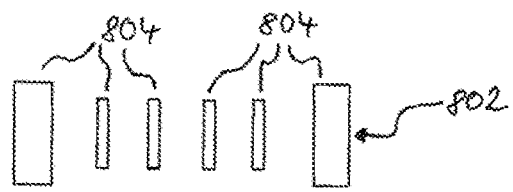

Referring to FIG. 8F, according to another embodiment, outermost alignment marks 804 (e.g. fence bars) of an alignment mark arrangement 802 may have a width which is different from the width of inner alignment marks 804 (e.g. measurement bars) of the alignment mark set 802, such that a pattern of alignment marks 804 of an alignment mark arrangement 802 shows another asymmetric mark (e.g. bar) width. For example, widths of two outermost marks 804 may be larger than widths of the remaining marks 804.

Figure 8G:
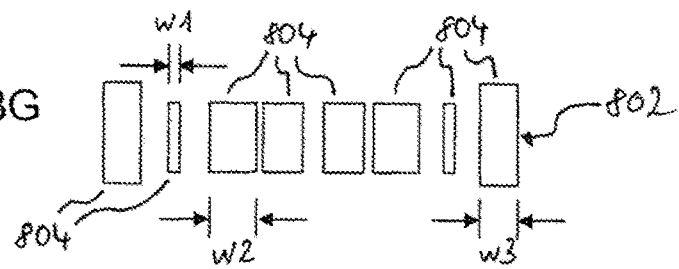

Referring to FIG. 8G, according to another embodiment, alignment marks 804 of an alignment mark arrangement 802 may include a third alignment mark, wherein the third alignment mark of the plurality of alignment marks may have a third width w3 that is different from the first width w1 and the second width w2.

In accordance with another embodiment, the first pair of neighboring alignment marks may include a first alignment mark and a second alignment mark neighboring the first alignment mark, and the second pair of neighboring alignment marks may include the second alignment mark and a third alignment mark neighboring the second alignment mark, as shown in FIG. 7B.

Figure 8H:
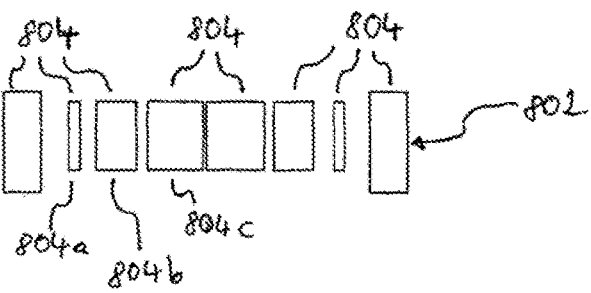

Referring to FIG. 8H, according to another embodiment, a third alignment mark of the plurality of alignment marks 804 may have a third width that is different from the first width and the second width. For example, first alignment mark 804a in FIG. 8H has a width that is different from a width of second alignment mark 804b of FIG. 8H and is different from a width of third alignment mark 804c of FIG. 8H.

In accordance with another embodiment, the second alignment mark 804b may be disposed between the first alignment mark 804a and the third alignment mark 804c, and the second width may be greater than the first width and the third width may be greater than the second width, as shown e.g. in FIG. 8H.

In accordance with another embodiment, the second alignment mark may be neighboring the first alignment mark and the third alignment mark.

In accordance with another embodiment, the second alignment mark may be disposed between the first alignment mark and the third alignment mark, and the second width may be smaller than the first width and the third width may be greater than the first width.

Figure 8I:
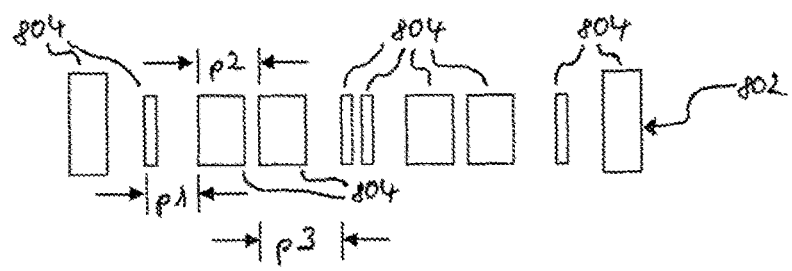

Referring to FIG. 8I, according to another embodiment, a third pair of neighboring alignment marks of the plurality of alignment marks 804 may be arranged at a third pitch p3 that is different from the first pitch p1 and the second pitch p2.

In accordance with another embodiment, the first pair of neighboring alignment marks may include a first alignment mark and a second alignment mark neighboring the first alignment mark, the second pair of neighboring alignment marks may include the second alignment mark and a third alignment mark neighboring the second alignment mark, and the third pair of neighboring alignment mark may include the third alignment mark and a fourth alignment mark neighboring the third alignment mark.

In accordance with another embodiment, the second pitch p2 may be greater than the first pitch p1 and the third pitch p3 may be greater than the second pitch p2, as shown in FIG. 8I.

In accordance with another embodiment, the second pitch may be smaller than the first pitch and the third pitch may be greater than the first pitch.

In accordance with another embodiment, the plurality of alignment marks may include a plurality of elongate alignment marks.

In accordance with another embodiment, the elongate alignment marks may be elongated perpendicular to a row direction.

In accordance with another embodiment, at least one of the elongate alignment marks may have a length greater than or equal to 20 µm.

In accordance with another embodiment, at least one of the elongate alignment marks may have a length e.g. in the range from about 20 µm to about 40 µm.

In accordance with another embodiment, at least one of the elongate alignment marks may have a width in the range from about 3 µm to about 5 µm.

In accordance with other embodiments, each of the elongate alignment marks may have at least one of a bar shape and a trench shape.

In accordance with another embodiment, each of the elongate alignment marks may have e.g. a rectangular bar shape.

In accordance with another embodiment, each of the elongate alignment marks may have e.g. a rectangular trench shape.

In accordance with other embodiments, the plurality of alignment marks may be arranged symmetrically about a symmetry center in the row.

In accordance with another embodiment, the plurality of alignment marks may include an even number of alignment marks.

In accordance with other embodiments, the plurality of alignment marks may include e.g. two, four, six, eight, ten, etc., alignment marks.

In accordance with another embodiment, the plurality of alignment marks may include an uneven number of alignment marks.

In accordance with other embodiments, the plurality of alignment marks 804 may include e.g. three, five, seven, nine, etc. alignment marks.

In accordance with various embodiments, an alignment mark arrangement may include a plurality of alignment marks disposed next to each other in a row, wherein the alignment mark arrangement may include an asymmetry in at least one of a pitch and a width of the alignment marks. In other words, at least one alignment mark may have a different width than at least one other alignment mark and/or at least one pair of neighboring alignment marks may have a different pitch than at least another pair of neighboring alignment marks.

In accordance with an embodiment, at least two alignment marks of the plurality of alignment marks of the alignment mark arrangement may have different widths.

In accordance with another embodiment, at least two pairs of neighboring alignment marks of the plurality of alignment marks of the alignment mark arrangement may have different pitches.

Figure 8J:
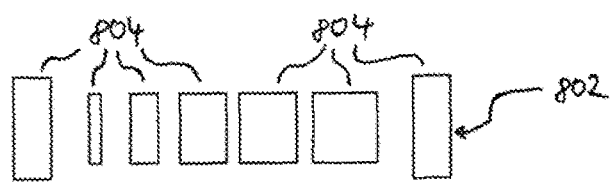

Referring to FIG. 8J, according to another embodiment, the plurality of alignment marks 804 may be arranged asymmetrically, e.g. there may be no symmetry center in the row. For example, a width of inner alignment marks may increase from an alignment mark at a first end of the row towards an alignment mark at a second end of the row.

In accordance with other embodiments, the outermost alignment marks 804 of the plurality of alignment marks 804, e.g. the fence bars, may be as long as or shorter than the inner alignment marks 804 of the plurality of alignment marks 804, e.g. the measurement bars.

As will be readily understood, the alignment mark arrangements shown in FIGS. 8B-J serve only as examples, and various other arrangements including alignment marks with different widths and/or pitches are possible.

Figure 9:
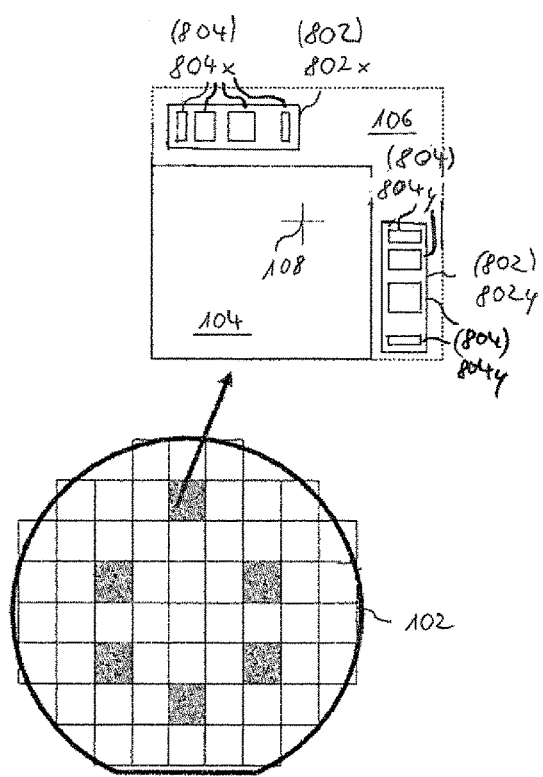
FIG. 9 shows a semiconductor workpiece including at least one alignment mark arrangement according to various embodiments.

FIG. 9 shows a semiconductor workpiece including at least one alignment mark arrangement according to various embodiments.

As shown in view 900 of FIG. 9, a semiconductor workpiece 102 in accordance with various embodiments may include at least one alignment mark arrangement 802, which may include a plurality of alignment marks 804 disposed next to each other in a row, wherein at least one of the following holds true: a first alignment mark of the plurality of alignment marks 804 has a first width and a second alignment mark of the plurality of alignment marks 804 has a second width that is different from the first width; a first pair of neighboring alignment marks of the plurality of alignment marks 804 is arranged at a first pitch and a second pair of neighboring alignment marks of the plurality of alignment marks 804 is arranged at a second pitch that is different from the first pitch.

In accordance with an embodiment, the semiconductor workpiece 102 may include or may be a wafer.

In accordance with another embodiment, the wafer may include a kerf region 106, wherein the at least one alignment mark arrangement 802 is disposed in the kerf region 106.

In accordance with another embodiment, the at least one alignment mark arrangement 802 may be configured as a fine-alignment mark arrangement of the wafer.

The alignment mark arrangement 802 may further be configured in accordance with one or more embodiments described herein.

Figure 10:
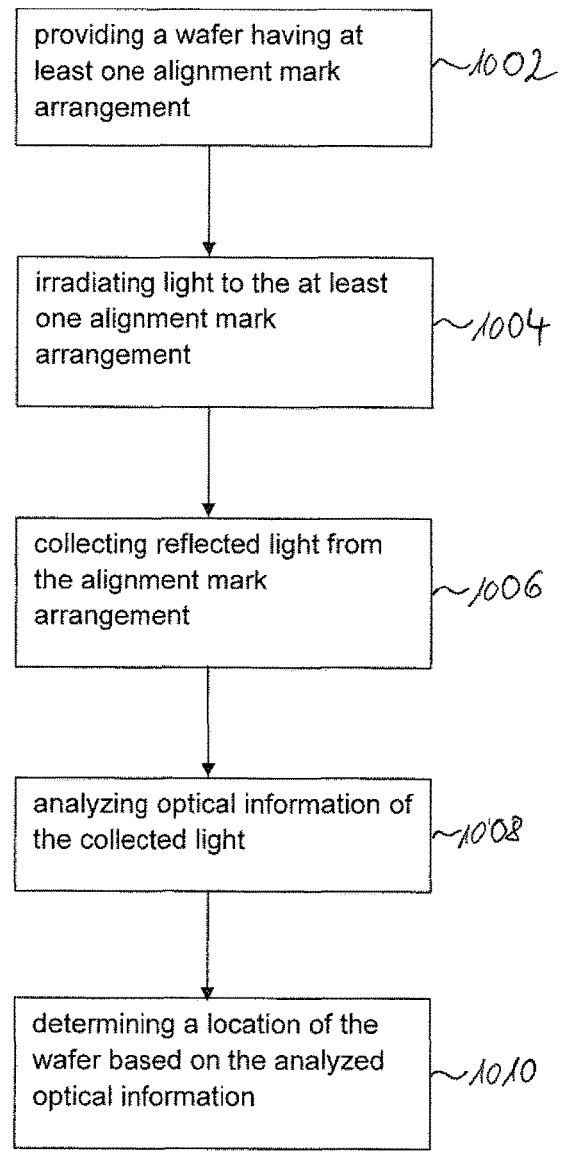
FIG. 10 shows a flow diagram illustrating a method for aligning a wafer according to various embodiments.

FIG. 10 shows a flow diagram illustrating a method for aligning a wafer according to various embodiments.

Referring to FIG. 10, a method for aligning a wafer according to various embodiments may include: providing a wafer having at least one alignment mark arrangement (step 1002), the alignment mark arrangement including a plurality of alignment marks disposed next to each other in a row, wherein at least one of the following holds true: a first alignment mark of the plurality of alignment marks has a first width and a second alignment mark of the plurality of alignment marks has a second width that is different from the first width; a first pair of neighboring alignment marks of the plurality of alignment marks is arranged at a first pitch and a second pair of neighboring alignment marks of the plurality of alignment marks is arranged at a second pitch that is different from the first pitch; irradiating light to the at least one alignment mark arrangement (step 1004); collecting reflected light from the alignment mark arrangement (step 1006); analyzing optical information of the collected light (step 1008); and determining a location of the wafer based on the analyzed optical information (step 1010).

In accordance with an embodiment, providing the wafer may include positioning the wafer on a wafer stage of a lithography apparatus.

In accordance with another embodiment, the alignment mark arrangement may include a first alignment mark and a second alignment mark disposed next to each other in a row, the first alignment mark having a first width and the second alignment mark having a second width, wherein the second width may be different from the first width.

In accordance with another embodiment, the alignment mark arrangement may include a first alignment mark, a second alignment mark, and a third alignment mark disposed next to each other in a row, wherein the second alignment mark may be disposed between the first alignment mark and the third alignment mark, and wherein the first and second alignment marks may be arranged at a first pitch and the second and third alignment marks may be arranged at a second pitch that is different from the first pitch.

In accordance with another embodiment, the alignment mark arrangement may include a plurality of alignment marks disposed next to each other in a row, wherein a first alignment mark of the plurality of alignment marks may have a first width and a second alignment mark of the plurality of alignment marks may have a second width that is different from the first width, and/or wherein a first pair of neighboring alignment marks of the plurality of alignment marks may be arranged at a first pitch and a second pair of neighboring alignment marks of the plurality of alignment marks may be arranged at a second pitch that is different from the first pitch.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An alignment mark arrangement, comprising:
a plurality of alignment marks disposed next to each other in a row extending along a first direction, the plurality of alignment marks comprising a first outermost alignment mark, a second outermost alignment mark, and at least one inner alignment mark disposed between the first and second outermost alignment marks,
wherein the alignment mark arrangement comprises an asymmetry in at least one of a pitch and a width of the alignment marks, the width being measured along the first direction, and
wherein the first and second outermost alignment marks and every alignment mark disposed between the first and second outermost alignment marks has a greatest dimension that extends along a second direction, the second direction transverse to the first direction, and
wherein a pitch between the first outermost alignment mark and a first inner alignment mark that neighbors the first outermost alignment mark is different than a pitch between first inner alignment mark and an alignment mark neighboring the first inner alignment mark on a side opposite to the first outermost alignment mark,
wherein the alignment mark neighboring the first inner alignment mark on a side opposite to the first outermost alignment mark is a further inner alignment mark.

2. The alignment mark arrangement of claim 1,
wherein at least two alignment marks of the plurality of alignment marks have different widths.

3. The alignment mark arrangement of claim 1,
wherein at least two pairs of neighboring alignment marks have different pitches.

4. The alignment mark arrangement of claim 1,
wherein the further inner alignment mark is an innermost alignment mark.

5. The alignment mark arrangement of claim 4, further comprising:
a second innermost alignment mark neighboring the further inner alignment mark.

6. The alignment mark arrangement of claim 1,
wherein the first and second outermost alignment marks have a length greater than a length of each alignment mark disposed between the first and second pair of outermost alignment marks, wherein the length is measured along the second direction.

7. The alignment mark arrangement of claim 1,
wherein the plurality of alignment marks includes an even number of alignment marks.

8. The alignment mark arrangement of claim 1, wherein the plurality of alignment marks are located in a kerf region of a semiconductor workpiece.

9. An alignment mark arrangement, comprising:
a plurality of alignment marks disposed next to each other in a row extending along a first direction, the plurality of alignment marks comprising a first outermost alignment mark, a second outermost alignment mark, and at least one inner alignment mark disposed between the first and second outermost alignment marks,
wherein the alignment mark arrangement comprises an asymmetry in at least one of a pitch and a width of the alignment marks, the width being measured along the first direction, and
wherein the first and second outermost alignment marks and every alignment mark disposed between the first and second outermost alignment marks has a greatest dimension that extends along a second direction, the second direction transverse to the first direction, and
wherein a pitch between the first outermost alignment mark and a first inner alignment mark that neighbors the first outermost alignment mark is different than a pitch between first inner alignment mark and an alignment mark neighboring the first inner alignment mark on a side opposite to the first outermost alignment mark,
wherein a pitch between the second outermost alignment mark and a second inner alignment mark that neighbors the second outermost alignment mark is different than a pitch between second inner alignment mark and an alignment mark neighboring the second inner alignment mark on a side opposite to the second outermost alignment mark.

10. The alignment mark arrangement of claim 9,
wherein the alignment mark neighboring the second inner alignment mark on a side opposite to the second outermost alignment mark is a second further inner alignment mark.

11. The alignment mark arrangement of claim 10, wherein the second further inner alignment mark is an innermost alignment mark.

\* \* \* \* \*